United States Patent [19]

Cowley

[11] Patent Number: 4,651,022
[45] Date of Patent: Mar. 17, 1987

[54] DIGITAL TOUCH OPERATED SWITCH

[76] Inventor: Edward L. Cowley, 5924 Minuteman Rd., Springfield, Va. 22152

[21] Appl. No.: 765,588

[22] Filed: Aug. 14, 1985

[51] Int. Cl.⁴ .................... H01H 35/00; H05B 37/02
[52] U.S. Cl. ................................. 307/116; 307/114; 307/139; 307/141; 323/245; 323/323; 323/904; 323/905; 315/362
[58] Field of Search ............... 323/322, 323, 324, 904, 323/905; 307/115, 116, 119, 134, 139, 140, 141, 141.4, 252 B; 315/362, DIG. 4

[56] References Cited

U.S. PATENT DOCUMENTS

| | | | |
|---|---|---|---|
| 3,666,988 | 5/1972 | Bellis | 315/362 X |
| 3,697,821 | 10/1972 | Johnson | 307/115 X |
| 3,919,596 | 11/1975 | Bellis | 315/294 |
| 4,169,982 | 10/1979 | Rittmann | 307/116 |
| 4,250,432 | 2/1981 | Kohler | 315/362 X |
| 4,396,869 | 8/1983 | Rosenbaum et al. | 315/362 X |
| 4,396,871 | 8/1983 | scheyermann | 323/322 X |
| 4,426,615 | 1/1984 | Hannas | 323/322 |
| 4,584,519 | 4/1986 | Gruodis | 323/905 X |
| 4,591,765 | 5/1986 | Beck | 307/140 X |

OTHER PUBLICATIONS

Burkhart et al., IEEE Transactions on Industry Applications, "Reverse Phase-Controlled Dimmer for Incandescent Lighting", vol. 1A-15, No. 5, Sep./Oct. 1979.

Primary Examiner—William M. Shoop, Jr.
Assistant Examiner—Sharon D. Logan
Attorney, Agent, or Firm—Dowell & Dowell

[57] ABSTRACT

A touch operated switch for control of electrical lighting, appliances, machinery and equipment which requires non sparking fail-safe operation. The switch utilizes digital complementary metal oxide semi-conductor technology which requires nearly insignificant standby power and incorporates a unique count down reset circuit which prevents extraneous operation from static discharge, radio frequency (RF) signals or power line transients. The switch will only respond to the electromagnetic flux generated by the power source that the controlled load is connected to. All other signals or pulses of differing frequencies are ignored by the switch thereby preventing inadvertent operation. Due to the limited number of discreet components utilized the total cost of manufacture will be extremely low and is expected to be less than the present manufacturing cost of the standard wall-type light switches that this invention will replace. The switch also simplifies inventory control due to the fact that a single switch type replaces all of the multi-pole mechanical switches currently utilized to provide switching capability from various locations.

8 Claims, 10 Drawing Figures

DIGITAL TOUCH OPERATED SWITCH

SUMMARY OF THE INVENTION

A touch operated switch for control of electrical lighting, appliances, machinery and equipment which requires non sparking fail-safe operation. The switch utilizes digital complementary metal oxide semi-conductor technology which requires nearly insignificant standby power and incorporates a unique count down reset circuit which prevents extraneous operation from static discharge, radio frequency (RF) signals or power line transients. Due to the limited number of discreet components utilized the total cost of manufacture will be extremely low and is expected to be less than the present manufacturing cost of the standard wall-type light switches that this invention will replace.

There are presently on the market numerous touch operated switches and most of them fall onto one of the two following catagories:

The majority of touch operated switches presently available employ high impedance 60 Hertz flux actuated circuits. These circuits are susceptable to operation by stray radio frequency signals, static discharge and power line transients. These types of touch actuated switches also exhibit erratic operation in the presence of electronic motor speed controller and lamp dimmers.

To overcome the erratic and extraneous operational characteristics of the above type of touch switch technology, a second category of touch switch utilizing body heat, infra-red radiation and/or special filters is available. These switches are utilized in hospital operating rooms, ordinance facilities and other areas where possible explosive atmospheres necessitate non-sparking touch type switches for control and illumination of electrical equipment in addition to the required reliability characteristics, these switches are also quite expensive.

The most common switches on the market, the standard single pole single throw "light switches", are mechanically operated and open or close a circuit by either shorting a set of contacts or by causing a small quantity of mercury to bridge a gap between conductors within a sealed container. The switch must be configured to handle the maximum current which flows through the controlled circuit. This means that the wire size which is required to handle the load current is the same size which must be connected to the switch and all voltage drop and "copper loss" calculations apply to the switch wires as well as to the wire which brings the power from the main distribution panel to the load. This also means that any change in the switch location requires rewiring of the circuit and in most cases is accompanied by structural changes in the facility which makes most electrical system changes cost prohibitive.

OBJECTS AND ADVANTAGES OF THE INVENTION

In view of the foregoing, it is an object of this invention to provide a reliable, solid-state, touch operated switch for all applications which presently utilize mechanical switches. These applications include all appliance, machinery and illumination controls.

It is another major object of this invention to provide a solid-state digital count and reset circuit which initiates switch activation when desired and prevents activation from extraneous sources, the switch utilizing circuitry which requires less than one watt of stand-by or operating power.

Another object of this invention is to provide a non-sparking, ultra-reliable, low-cost, touch operated switch for all applications which require low voltage remote operation similar to the expensive touch switch technology currently utilized in hospitals and other special or hazardous facilities.

A further object of this invention is to provide an extremely reliable, low cost, rugged and compact, long lasting touch operated switch which, due to its inherent invulnerability to extraneous signal activation, permits the switch to replace existing mechanical (wall light) switches and which can be installed by the average do-it-yourself individual. This touch operated switch provides a low sensor inputs from several physically separated touch sensitive sources and still provide positive control of the load.

Still another object of this invention is to provide remote switching capability in the average home which permits the occupants to control electrical circuits in the home from remote locations, and to change the controlling location at will, without the necessity of rewiring the system. The touch operated switches can be coded to require any number of input pulses to actuate the circuit, thereby permitting adapting of the switch for controlling heavy machinery, safety circuits, or special security installations. In addition, the switch utilizes a unique internal timer to provide the hysteresis necessary for single point switch activation "on" or "off", and further provides an inherent emergency signalling capability by a person maintaining continuous contact with the sensor.

The foregoing as well as other objectives and advantages of this invention may be more clearly understood by reference to the following detailed description which when taken with the drawings illustrate certain aspects of the present invention.

PREFERRED EMBODIMENTS

Figure 1:
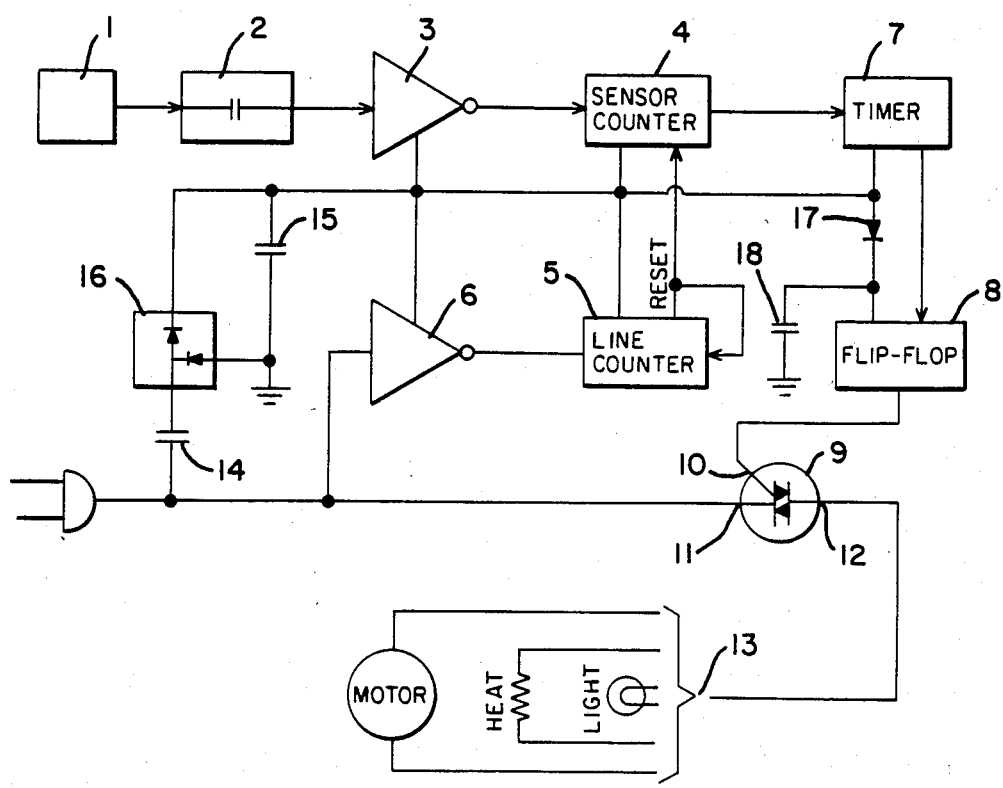
FIG. 1 is a schematic representation of the invention.

In FIG. 1, the invention major components are represented by numerals 1–18. The touch sensor, numeral 1, is connected either directly or by shielded wire to the switch circuit via an isolation network, 2. A person or object touching the sensor causes a capacitive coupling to ground of approximately two hundred (200) pico farads which provides a signal path for the "sine wave" power line induced pulses. These pulses occur at a 60 hertz rate (line frequency) in the United States and at 50 hertz in most of Europe. The pulses, at the power line frequency are coupled by the isolation network, 2, to the input of a Schmitt Trigger, 3. The Schmitt Trigger, 3, provides the hysteresis necessary to isolate the follow circuits from the spurious effects of noise of the input signal. The Schmitt Trigger, 3, also generates fast transitions from the slow rising "sine wave" input signals. The symetrical square wave output of the Schmitt Trigger, 3, is connected to the clocking input of the digital count-down circuit, 4, which is the heart of this invention.

The digital count-down circuit, 4, is a divide by "N" counter which is configured by the manufacturer to permit an output only after a predetermined number of sensor input pulses are received. The sensor input counter, 4, is also provided with a reset capability which, when activated, causes the counter, 4, to reset and begin the sensor signal pulse count at "0". The reset pulse for the sensor counter, 4, reset circuit is derived from a second digital countdown circuit, 5. The second counter, 5, is also a divide by "N" circuit which is configured by the manufacturer to provide an output only after a predetermined number of input pulses are received. The line counter, 5, is set to provide an output at a number greater than the number selected for the sensor counter, 4. Therefore if the sensor counter, 4, is configured to provide an output of the 16th pulse, the line counter, 5, would be required to provide a reset pulse at some number greater than 16, or if the same number of pulses is desired for both counters 4 and 5 the sensor counter would be configured to increment on the leading edge of each pulse while the line counter, 5, increments only on the pulse trailing edge. A pulse leading edge is considered to be the low to high transition of the square wave and trailing edge is the high to low transition.

The input pulses for the line counter, 5, are derived directly from the power line serving the switched circuit. The power line is connected to the input of a Schmitt Trigger, 6, which provides the same function for the power line signals as the Schmitt Trigger, 3, does for the sensor signals. It is understood, then, that the sensor counter, 4, can only provide an output if it receives the proper number of input pulses prior to receiving a reset pulse from the line counter, 5. As an example, in practice, assume that contact is made with the sensor, 1, initiating the sensor count at the same instant that the line counter, 5, has reached a count of "3". Assume also that the sensor counter, 4, requires a count of 16 to generate an output and that the line counter, 5, provides a reset pulse on the 17th count. The sensor counter, 4, will have only reached a count of "14" by the time the line counter, 5, reaches "17", generates an output, and causes the sensor counter, 4, to reset to "0". In order for the sensor counter, 4, to generate an output, contact with the sensor must be maintained for an additional 16 pulses at the power line frequency. In the above scenario, the total time between initiation of contact and the generation of an output by the sensor counter, 4, is one half ($\frac{1}{2}$) second in a 60 hertz circuit. This is determined by adding the first fourteen (14) pulses, prior to system reset, to the sixteen (16) pulses required for operation.

The delay circuit timer, 7, generates an output when an input signal is received from the sensor counter, 4. The delay circuit timer, 7, is configured to ignore inputs received at a rate greater than one (1) per one half ($\frac{1}{2}$) second. This prevents sudden on/off applications of line power to the switched load which would be caused by failure of the person or object touching the sensor, 1, to break contact immediately following switch activation. The scenario above required sixteen (16) pulses for switch activation, therefore, continuous contact with the sensor, 1, will cause the sensor counter, 4, to generate an output at a rate just slightly less than four (4) times per second, however, the timer prevents switch operation at a rate greater than approximately once per second. The delay circuit timer, 7, permits an apparently immediate operation of the switch upon contact with the sensor, 1, but also provides a comfortable time delay to enable breaking contact when the desired switch action (on or off) is accomplished. Continuous contact with the sensor, 1, will cause the switch to cycle on and off at approximately the rate determined by the delay circuit timer, 7, which permits utilization of the switch for emergency signaling, advertising, or warning applications.

Operation of the Triac, 9, is also fairly well understood. The Triac functions as a solid-state switch which permits electrical current flow between the main terminals, 11 and 12, only when the proper voltage is applied to the gate terminal, 10. When the flip-flop, 8, output is in the "on" state, gate voltage is applied to the Triac, 9, gate terminal, 10, allowing current flow between terminals 11 and 12, which causes power to be applied to the load, 13. When the flip-flop, 8, is off, the Triac, 9, gate terminal, 10, is grounded which causes the Triac to exhibit an "open circuit" between the main terminals, 11 and 12, preventing application of electrical power to the load.

Standby power for the touch operated switch is derived from the power line and utilizes the capacitive reactance (Xc) of a small capacitor, 14, to provide the voltage drop necessary for system operation. The main advantages of capacitive reactance utilization as opposed to resistance for voltage drop is that the current across the capacitor leads the voltage by approximately 90 degrees which means a nearly "0" power factor. Since power dissipation is calculated by multiplying the voltage drop by the current flow by the power factor, it is readily seen that only an insignificant amount of power is lost in heat by utilization of a capacitor, 14, in the touch operated switch power supply, 16. Capacitor, 15, is utilized, in conjunction with two diodes within the integrated circuit, to provide the filtered direct current (DC) supply necessary for system operation.

The extremely high input impedance inherent in CMOS logic elements, (approximately $1 \times 10$ megohms) and the very low leakage characteristics exhibited by modern large molecule plastic dielectric capacitors combine to provide the invention with memory capability which does not require battery backup during power line interruptions. Memory retention is provided by the fact that CMOS devices require supply current only when actually counting or switching, therefore, when the input power is interrupted, the only requirement for memory retention is to maintain a static voltage across the flip-flop, 8, supply terminals until power is restored. The necessary static charge is provided by capacitor, 18.

Capacitor, 18, is connected across the flip-flop, 8, supply terminals and during normal switch operation is charged through diode, 17. The diode, 17, prevents discharge of capacitor, 18, through other elements of the touch switch when line power fails. When line power is restored following an interruption the flip-flop, 8, output state will be as it was when the interruption occurred. The touch switch memory feature is particularly desirable in those applications where the switch controls power to equipment such as a furnace, air conditioner, water pump, security lighting, or other normally unattended switching applications.

Figure 2A:
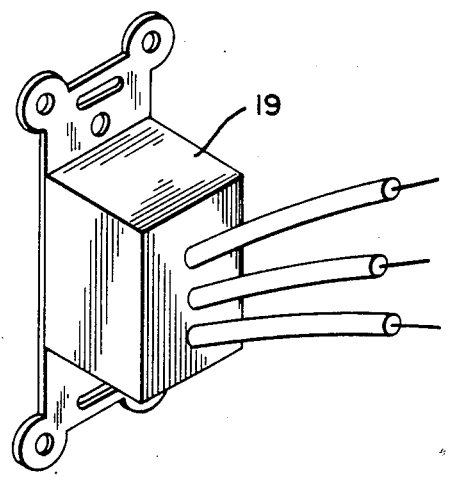
FIG. 2 is a pictorial representation of the invention installed as a replacement for a common light switch.
Figure 2B:
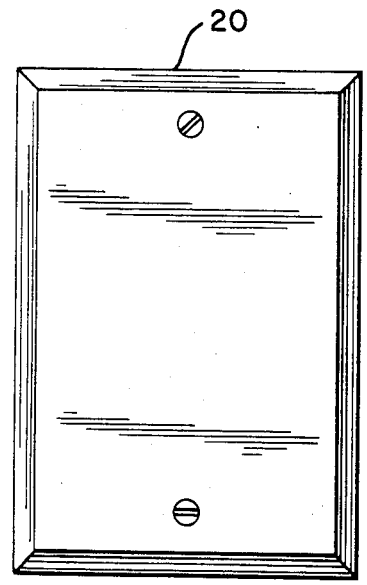

FIG. 2 illustrates the touch switch configured as a direct replacement for standard toggle type wall switches. The monolithic very large scale integrated circuit (VLSIC) is totally encapsulated in a non-conductive plastic compound, 19, to protect the circuit from environmental conditions and to provide a low cost unit package. The switch is provided with three color coded wires and instructions for installing in accordance with the "National Electrical Code". A switch box cover plate, 20, either blank or decorative, will be provided with each switch.

Figure 3:
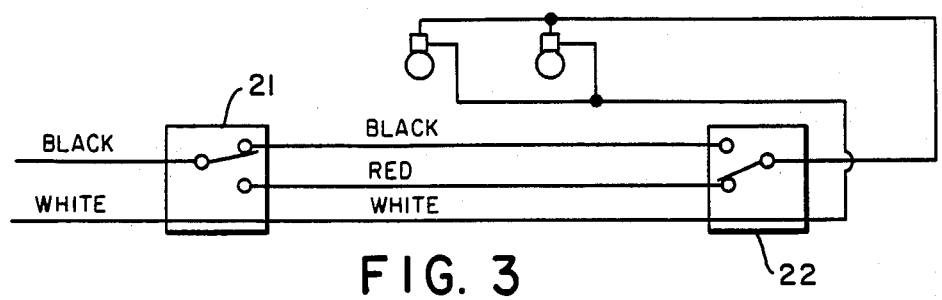
FIG. 3 is a conventional multiple switch light control schematic.

In applications which normally require two or more switches, such as "2-way" and "3-way" circuits, the present invention will perform the same function with only one switch. FIG. 3 depicts the conventional prior art method for wiring a typical stair light for control from two locations. Input power from the circuit breaker or fuse panel is connected to a single-pole-double-throw (SPDT) switch, 21. The black "hot" wire is switched to either the black or red wire which is connected between the switches 21 and 22. The second SPDT switch, 22, selects either the black or red wire as an input and, depending on the position of switch 21, applies or removes the line power to the lighting fixture, 23. As the number of switch positions increases, the wiring complexity, switch cost and number of conductors required for hook-up increases accordingly.

Figure 4:
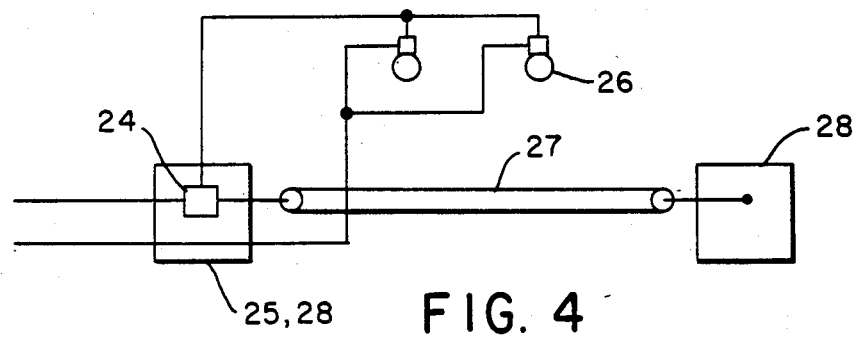
FIG. 4 is a multiple sensor light control circuit schematic utilizing the present invention.

FIG. 4 schematically depicts a typical installation which provides for control of a remote light from several sensors but utilizes only one unit of the present invention. The touch operated switch, 24, is installed in the first Box 25 between the supply voltage and the light fixture, 26. The box cover plates, 28, are connected together by low cost shielded wire, 27, and contact with any one of them will cause switch activation.

Figure 5A:
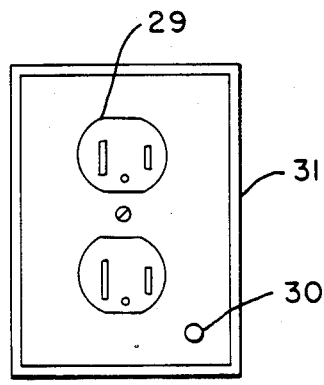
FIG. 5 is a pictorial representation of a duplex outlet with touch switch jack for remote operation.
Figure 5B:
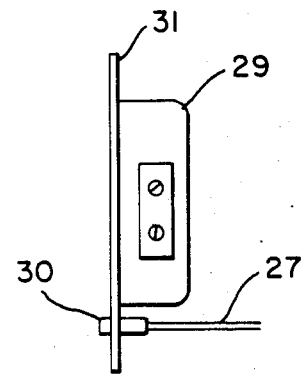
Figure 6:
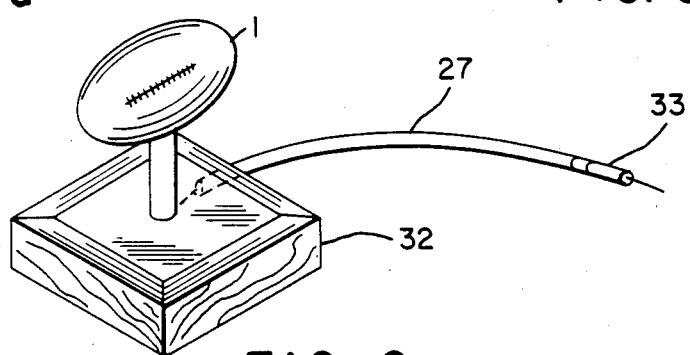
FIG. 6 is a typical remote sensor pictorial representation.
Figure 7:
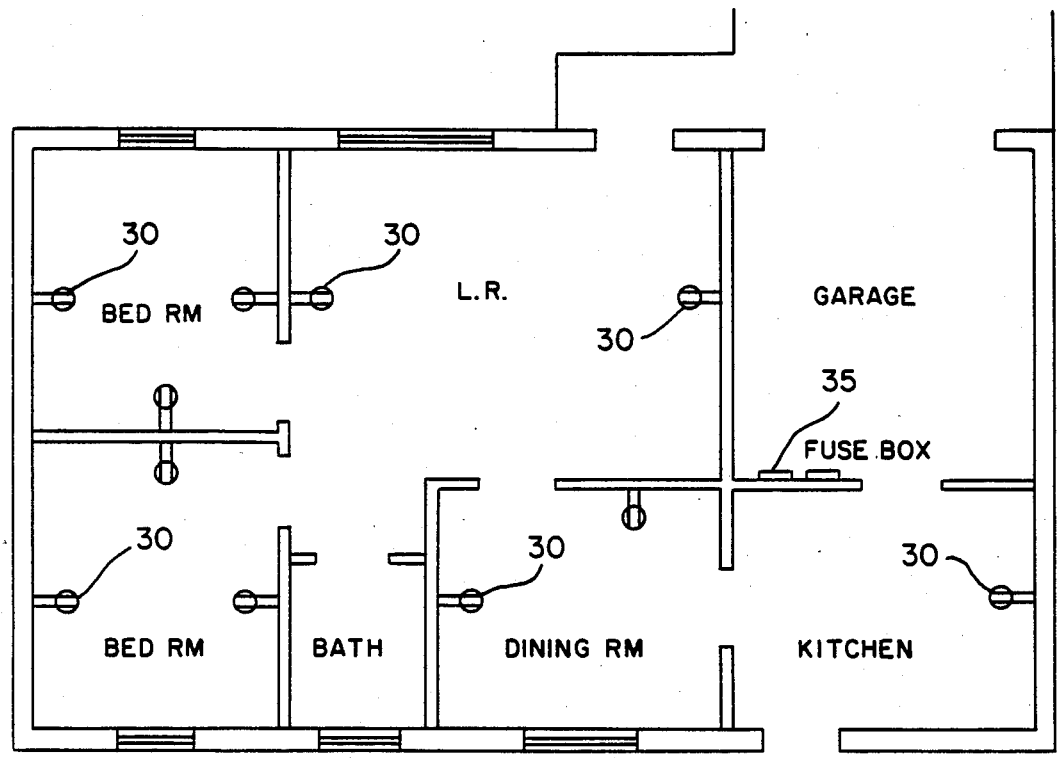
FIG. 7 is a floor plan depicting remote sensor jacks installed in a typical residence.

FIG. 5 depicts a duplex electrical outlet, 29, with molded in touch switch sensor connected, 30, in the box cover, 31. A typical remote sensor is schematically depicted by FIG. 6. The sensor itself is any conductive object, 1, mounted on a nonconductive base, 32. The conductive object, 1, is connected to the shielded conductor of wire, 27. The wire, 27, can be any convenient length. Lengths of six, twelve and eighteen feet have been successfully employed with the engineering development models. The shielded wire, 27, is terminated in a standard "RCA" type plug, 33, which mates with the connectors installed in the duplex oulet covers illustrated in FIG. 5. It should be noted that and "RCA" type jack will also be installed in all units employing the touch switch unless the unit is provided with an integral sensor such as the wall switch depicted by FIG. 2. FIG. 7 represents an example of the touch switch utilization in a typical residence. As shown, at least one electrical outlet in each room would be provided with the unit depicted by FIG. 5. The duplex electrical outlets will be wired normally in accordance with existing code requirements and the associated sensor connector, 30, would be connected to a centralized switch matrix panel, 35, by low cost American Wire Gage (AWG) size 24 shielded wire.

Figure 8:
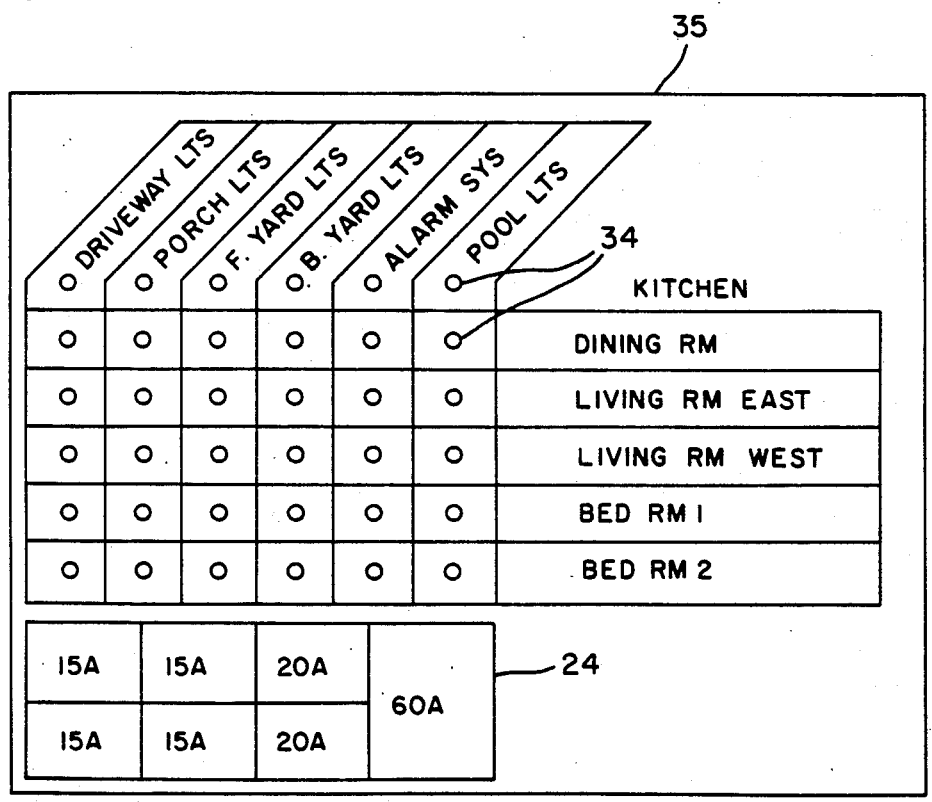
FIG. 8 is a pictorial representation of the remote switching matrix in a typical residence utilizing the invention.

The purpose of the switch matrix, FIG. 8, is to permit a user to control a number of remote electrical circuits from selected sensor locations and to change the selected locations at will without the necessity of rewiring the system.

Again, referring to FIG. 7, in establishing the system operating configuration, a user need only determine which electrical circuits are to be controlled from which sensor location and then activate the appropriate matrix junction by inserting a plastic pin at the appropriate intersection. The panel, 35, operates in classic matrix fashion in that contact at a junction completes the circuit between the associated row and column functions. Each controlled circuit is initially wired to a touch operated switch which is installed in the matrix panel. The actual touch switch modules, 24, are plug-in units to enable the system to accommodate various power load requirements and to afford the system maximum flexibility.

The switch module, 24, sensor inputs are connected to designated "columns" within the matrix, 34, and the circuits are identified in the indicated spaces across the top. Each remote sensor cable is connected to a "row" and the associated location is indicated in the horizontal spaces extending down the side of the matrix switch, 34. Insertion of a plastic pin in a hole in the switch causes electrical connection between the selected "row" and "column". The selected circuits are then controlled by physical contact with the sensors (FIG. 6) plugged into the appropriate remote connectors. A selected circuit can also be controlled from several locations if desired.

In practice, the touch operated switch described herein has proven to be extremely reliable in operation. Twenty (20) versions of the switch have been constructed for testing. The units have been subjected to a combined total of over 150,000 hours of operation and the only failures were attributed to discrete components which will not be utilized in production units. All of the test units utilized integrated circuits of the complementary metal oxide semiconductor (CMOS) logic family to assure reliable operation with minimal standby power consumption. The switched loads consist of both incandescent and fluorescent lighting, a vacuum cleaner, a wood turning lathe, electric drills, a router and other power tools. In all cases, the switch performed without fault.

Although each of the development models of the test switch utilized individual integrated curcuits and other discrete components, production models of the switch will employ large scale integration (LSI) techniques which will reduce the number of discrete components required. This will allow total encapsulation of the units to provide immunity from shock, vibration and moisture. It also provides for small size and low cost packaging.

In view of the foregoing, specific forms of the present invention have been described in detail. Modifications, however, may occur to those skilled in the art without departing from the spirit of the present invention.

I claim:

1. A solid-state touch-operated switch for use in an environment permeated by electromagnetic flux from adjacent power lines, the switch being responsive to input signals at power line frequency to turn "ON" and "OFF" power from the power lines to a load, the switch comprising:
    (a) triac means connected to control the flow of power from the power lines to the load and having a control gate;
    (b) flip-flop means having an input and having a bistable output connected to the gate to turn the triac means "ON" and "OFF" depending upon the binary state of the bistable output;

(c) a touch sensor accessible for touching by an operator of the switch; a monostable trigger circuit having an input and an output; network means connecting the touch sensor with the trigger circuit input; and a digital sensor counter operative to count to N and connected to have its count incremented by output from the trigger circuit at power line frequency, the sensor counter having a reset terminal and having a control signal output coupled to the input of the flip-flop means and operative when the counter completes its count to N to deliver an output signal to toggle the flip-flop means; and (d) a digital power-line counter having an input connected to be actuated by cycles of the power line to increment the count, the power-line counter having a reset terminal and being operative to count to a number high enough to allow time for the sensor counter to count to N, and the power-line counter being operative to deliver an output pulse for each completed count, the output pulse being coupled to both reset terminals to reset both counters;

(e) whereby unless the sensor counter counts to N before the power-line counter completes its count and resets both counters, no output signal will be delivered by the sensor counter to toggle the flip-flop.

2. The touch-operated switch as set forth in claim 1, further including a delay timer interposed between the signal output of the sensor counter and the input of the flip-flop means, whereby to prevent sequential "ON"-"OFF" operation of the switch at a rate higher than a predetermined maximum set by the delay of the timer, and to provide time for the operator to break contact with the touch sensor after a desired operation of the switch has occurred.

3. The touch-operated switch as set forth in claim 2, wherein the load comprises light means, and the delay of the delay timer is selected to provide a desired rate of "ON"-"OFF" BLINKING of the light means when the operator maintains continuous contact with the touch sensor.

4. The touch-operated switch as set forth in claim 1, wherein the flip-flop means comprises CMOS logic which uses substantially no current except when toggling; and power supply memory means including diode coupling and capacitive storage of operating potential connected to the flip-flop means to maintain its stable state during a temporary power line failure.

5. The touch-operated switch as set forth in claim 1, wherein said monostable trigger circuit comprises a Schmitt trigger having a long "ON" interval for isolating the sensor counter from sensed extraneous noise signals, and wherein the network means comprises capacitive impedance means isolating the trigger circuit from the touch sensor.

6. The touch-operated switch as set forth in claim 1, which comprises an integrated circuit mounted on a plate and shaped for substitution for a mechanical switch assembly in a standard electrical wall box.

7. The touch-operated switch as set forth in claim 1, which is connected to control a load, wherein a second touch sensor is mounted remotely from the switch, and connected in parallel with the touch sensor of the switch by a conductor within grounded shielding.

8. A control for controlling multiple diverse loads, each individually connected with a corresponding one of multiple switches as set forth in claim 1, and the control including a control panel comprising a matrix of crossing conductor grids, means at each crossing of the grids for selectively connecting the conductors together, the conductors of one grid being coupled respectively to the trigger circuits of said multiple switches; and multiple remotely located second touch sensors, the second sensors being respectively connected with the conductors of the other grid, whereby the sensors can be selectively coupled to control the switches by said connecting means.

* * * * *